(12) United States Patent
Yoshida et al.

(10) Patent No.: US 6,313,520 B1
(45) Date of Patent: Nov. 6, 2001

(54) RESIN-SEALED POWER SEMICONDUCTOR DEVICE INCLUDING SUBSTRATE WITH ALL ELECTRONIC COMPONENTS FOR CONTROL CIRCUIT MOUNTED THEREON

(75) Inventors: Takanobu Yoshida; Toshiaki Shinohara; Hisashi Kawafuji, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/664,341

(22) Filed: Sep. 18, 2000

(30) Foreign Application Priority Data

Mar. 7, 2000 (JP) .................................................. 12-062220

(51) Int. Cl.[7] .................................................. H01L 23/495
(52) U.S. Cl. ......................... 257/676; 257/676; 257/666; 257/691; 257/724
(58) Field of Search .................................. 257/666, 676, 257/691, 723, 724, 686

(56) References Cited

U.S. PATENT DOCUMENTS

| | | | |
|---|---|---|---|
| 5,083,189 | * | 1/1992 | Sawaya . |
| 5,291,054 | * | 3/1994 | Tanaka et al. . |
| 5,313,095 | * | 5/1994 | Tagawa et al. . |
| 5,434,449 | * | 7/1995 | Himeno et al. . |
| 5,703,399 | * | 12/1997 | Majumdar et al. . |
| 5,767,573 | * | 6/1998 | Noda et al. . |
| 5,792,676 | * | 8/1999 | Masumoto et al. . |
| 5,998,856 | * | 12/1999 | Noda et al. . |
| 6,002,166 | * | 12/1999 | Noda et al. . |
| 6,184,585 | * | 2/2001 | Martinez et al. . |

* cited by examiner

Primary Examiner—Sheila V. Clark
(74) Attorney, Agent, or Firm—Oblon, Spivak, McClelland, Maier & Neustadt, P.C.

(57) ABSTRACT

A resin-sealed power semiconductor device is provided. The thicknesses of a die pad (19) and a lead part (2) are made equal and as great as possible. A thick film substrate (8) is bonded with a bonding layer (20) onto a plurality of supporting inner leads (2AS) among first inner leads (2A1) positioned above the die pad (19). Patterns of a control circuit of power semiconductor elements (1) are formed as thick film patterns (10) on an upper surface of the substrate (8), and a control circuit element (IC) (9) and all electronic components (12) are mounted on the patterns (10) by soldering. The constituents (9, 12, 10, 8, 1, 2A1, 19, 2B1) are sealed in a sealing resin (5). The resin-sealed power semiconductor device improves noise immunity while conventionally effectively dissipating heat generated by the power semiconductor elements, and is designed to be adaptable to increase in functionality thereof.

10 Claims, 11 Drawing Sheets

RESIN-SEALED POWER SEMICONDUCTOR DEVICE INCLUDING SUBSTRATE WITH ALL ELECTRONIC COMPONENTS FOR CONTROL CIRCUIT MOUNTED THEREON

BACKGROUND OF THE INVENTION

1. Field of the Invention

The present invention relates to a structure of a resin-sealed (resin-encapsulated) power semiconductor device.

2. Description of the Background Art

FIG. 10 is a vertical sectional view of a first prior art resin-sealed power semiconductor device shown as mounted to a final product. In FIG. 10, the reference character 1P designates power semiconductor elements; 2AP and 2BP designate lead parts of a frame serving as electrodes; 3P designates brazing materials for bonding the power semiconductor elements 1P to an upper surface of a die pad 19P of the frame; 4P designates thin metal wires such as aluminum wires for connection between each of the electrodes 2AP and 2BP and each of the power semiconductor elements 1P or between the power semiconductor elements 1P; and 5P designates a sealing resin.

For efficient diffusion of heat from the power semiconductor elements 1P to their immediately underlying components, the thicknesses of the lead parts 2AP and 2BP of the frame and the die pad 19P are made equal and yet possibly maximized.

Further, outer leads of the lead parts 2AP and 2BP serving as electrodes are formed into a shape mountable outside the sealing resin 5P, and subjected to surface treatment such as solder plating at their predetermined portions.

After shipment, the resin-sealed power semiconductor device having the above-mentioned structure is incorporated into customer's device on the customer's premises by bonding a substrate 6P including a control circuit for controlling the semiconductor device to the plated portions of the lead parts 2AP and 2BP of the semiconductor device with solder 7P, as shown in FIG. 10. The control circuit comprises a semiconductor element (IC) 9P such as a microcomputer for controlling the power semiconductor elements 1P, and electronic components 12P such as a resistor and a capacitor.

FIG. 11 is a vertical sectional view of a second prior art resin-sealed power semiconductor device. The device of FIG. 11 differs from the device of FIG. 10 in that the device of FIG. 11 itself contains the semiconductor element (IC) 9P such as a microcomputer shown in FIG. 10, the element 9P being mounted on an inner lead of the lead frame 2BP. For customer's use of the power semiconductor device, it is also necessary to bond the control substrate 6P with all of the electronic components 12P for the control circuit mounted thereon to an outer lead tip of the power semiconductor device of FIG. 11 by soldering, as shown in FIG. 10, on the customer's premises.

(1) The first and second prior art power semiconductor devices described above present a problem such that a long path from the power semiconductor elements 1P to the electronic components 12P provided on the control substrate 6P for controlling the power semiconductor elements 1P decreases noise immunity.

(2) In the first and second prior art practices, the thicknesses of the lead parts and the die pad are made equal and yet as great as possible, as above described, for the purpose of efficiently diffusing heat generated by the power semiconductor elements 1P. To solve the above-mentioned problem (1), it is desirable that all of the multiplicity of electronic components 12P constituting the control circuit of the power semiconductor elements 1P, together with the semiconductor element (IC) 9P in the control circuit, are mounted on the inner leads of the lead parts. However, such an attempt to contain all of the components of the control circuit in the sealing resin inevitably results in a hyperfine inner lead pattern, thereby to significantly decrease a pitch between adjacent inner leads. As a result, another problem is encountered such that it is quite difficult to form such a hyperfine pattern of the inner leads which are made as thick as possible by press working, etching or the like. With increasing functionality of the power semiconductor device, the number of electronic components constituting the control circuit contributing to the increase in functionality is on the increase, and the scale of the control circuit is accordingly increasing. This requires a much finer inner lead pattern, to make the problem more serious.

SUMMARY OF THE INVENTION

According to a first aspect of the present invention, a resin-sealed power semiconductor device comprises: a frame part comprising a lead part having a plurality of inner leads and a plurality of outer leads continuous respectively with the plurality of inner leads, and a die pad equal in thickness to the lead part; a power semiconductor element mounted on a portion of the die pad; a substrate bonded onto a support of the frame part except the portion of the die pad; a pattern of a control circuit of the power semiconductor element, the control circuit pattern being formed on at least a first main surface of the substrate; a semiconductor element mounted on the control circuit pattern for controlling the power semiconductor element; electronic components all mounted on the control circuit pattern and constituting the control circuit in conjunction with the semiconductor element; and a sealing resin for sealing therein the plurality of inner leads, the die pad, the power semiconductor element, the substrate, the semiconductor element and all of the electronic components.

Preferably, according to a second aspect of the present invention, in the resin-sealed power semiconductor device of the first aspect, the support of the frame part comprises at least two supporting inner leads among the plurality of inner leads.

Preferably, according to a third aspect of the present invention, in the resin-sealed power semiconductor device of the second aspect, the substrate is a ceramic substrate; and the control circuit pattern is a thick film pattern.

Preferably, according to a fourth aspect of the present invention, in the resin-sealed power semiconductor device of the second aspect, the substrate is a glass epoxy substrate.

Preferably, according to a fifth aspect of the present invention, in the resin-sealed power semiconductor device of the second aspect, the substrate comprises a plurality of through hole parts equal in number to the at least two supporting inner leads; a conducting pattern is provided for each of the through hole parts and formed on a wall surface of each of the through hole parts and on portions of the first main surface and a second main surface of the substrate which surround each of the through hole parts; and a portion of the conducting pattern on the second main surface is bonded with a conductive bonding layer to an associated one of the at least two supporting inner leads.

Preferably, according to a sixth aspect of the present invention, in the resin-sealed power semiconductor device of the fifth aspect, the substrate is a glass epoxy substrate.

Preferably, according to a seventh aspect of the present invention, in the resin-sealed power semiconductor device of the second aspect, the support comprises supporting inner leads adjacent to each other.

Preferably, according to an eighth aspect of the present invention, in the resin-sealed power semiconductor device of the first aspect, the support of the frame part corresponds to another portion of the die pad.

Preferably, according to a ninth aspect of the present invention, in the resin-sealed power semiconductor device of the first aspect, the support of the frame part comprises first and second supporting inner leads among the plurality of inner leads. At least one intermediate inner lead among the plurality of inner leads which is present between the first and second supporting inner leads is shorter than the first and second supporting inner leads. The substrate includes a first end portion supported by the first supporting inner lead, with a bonding layer therebetween, a second end portion opposite from the first end portion and supported by the second supporting inner lead, with the bonding layer therebetween, and third and fourth end portions opposite from each other and orthogonal to the first and second end portions, the third and fourth end portions being unsupported by the at least one intermediate inner lead. The control circuit pattern includes a first control circuit pattern formed on a first main surface of the substrate, and a second control circuit pattern formed on a second main surface of the substrate, the second main surface being opposite from the first main surface. The semiconductor element and some of the electronic components are mounted on the first control circuit pattern, and the remainder of the electronic components are mounted on the second control circuit pattern.

Preferably, according to a tenth aspect of the present invention, in the resin-sealed power semiconductor device of the ninth aspect, the substrate is a glass epoxy substrate.

The resin-sealed power semiconductor device according to the first through tenth aspects of the present invention has the effects of: (1) efficiently dissipating heat generated by the power semiconductor element through the die pad, as in the prior art devices; (2) permitting the semiconductor element and all of the electronic components which constitute the control circuit to be disposed within the sealing resin, to significantly reduce the length of a path between the power semiconductor element and the control circuit, thereby dramatically improving noise immunity over the prior art devices; and (3) easily achieving, within the sealing resin, the size reduction of the control circuit pattern resulting from the increase in functionality of the semiconductor device without the problem of finer patterning of the inner leads because of the provision of all of the electronic components for the control circuit on the substrate. Therefore, the semiconductor device can achieve the fine patterning of the control circuit of the power semiconductor element while satisfactorily maintaining the property of dissipating heat generated by the power semiconductor element, and also is adaptable to the increase in functionality of the control circuit compactly.

The resin-sealed power semiconductor device according to the third aspect has the effect of more easily achieving the size reduction of the control circuit pattern.

The resin-sealed power semiconductor device according to the fifth aspect has the effect of easily establishing electric connection between the inner leads and the control circuit pattern by means of the conducting pattern provided in each of the through hole parts, thereby eliminating the need to provide bonding pads for such electric connection. The device also has the effect of disposing the through hole parts in any position.

Furthermore, the resin-sealed power semiconductor device according to the ninth aspect is capable of mounting the components of the control circuit on the opposite main surfaces of the substrate. This reduces the size of the substrate and accordingly the size of the semiconductor device, thereby further improving the noise immunity.

It is therefore an object of the present invention to provide a resin-sealed power semiconductor device having high noise immunity while maintaining the diffusion of heat generated by a power semiconductor element at a conventional level, and designed to be easily adaptable to increase in functionality thereof.

These and other objects, features, aspects and advantages of the present invention will become more apparent from the following detailed description of the present invention when taken in conjunction with the accompanying drawings.

DESCRIPTION OF THE PREFERRED EMBODIMENTS (First Preferred Embodiment)

According to a first preferred embodiment of the present invention, a pattern for a control circuit of a power semiconductor element is provided on a first main surface of a thick film substrate defined in a manner described later, and all components (a power semiconductor device control IC and other electronic components) constituting the control circuit are mounted on the pattern, whereas a second main surface of the thick film substrate opposite from the first main surface is bonded to a support of a frame part with a bonding layer. The thick film substrate on which all components constituting the control circuit are mounted, the support of the frame part, the power semiconductor element mounted on a die pad of the frame part, and thin metal wires (such as Al wires) connecting the parts are sealed in sealing resin. The thicknesses of portions of the frame part are made equal and as great as possible. In the first preferred embodiment, the support is comprised of at least two inner leads (referred to as supporting inner leads) among a plurality of inner leads. The first preferred embodiment will now be described in detail with reference to the drawings.

Figure 1:
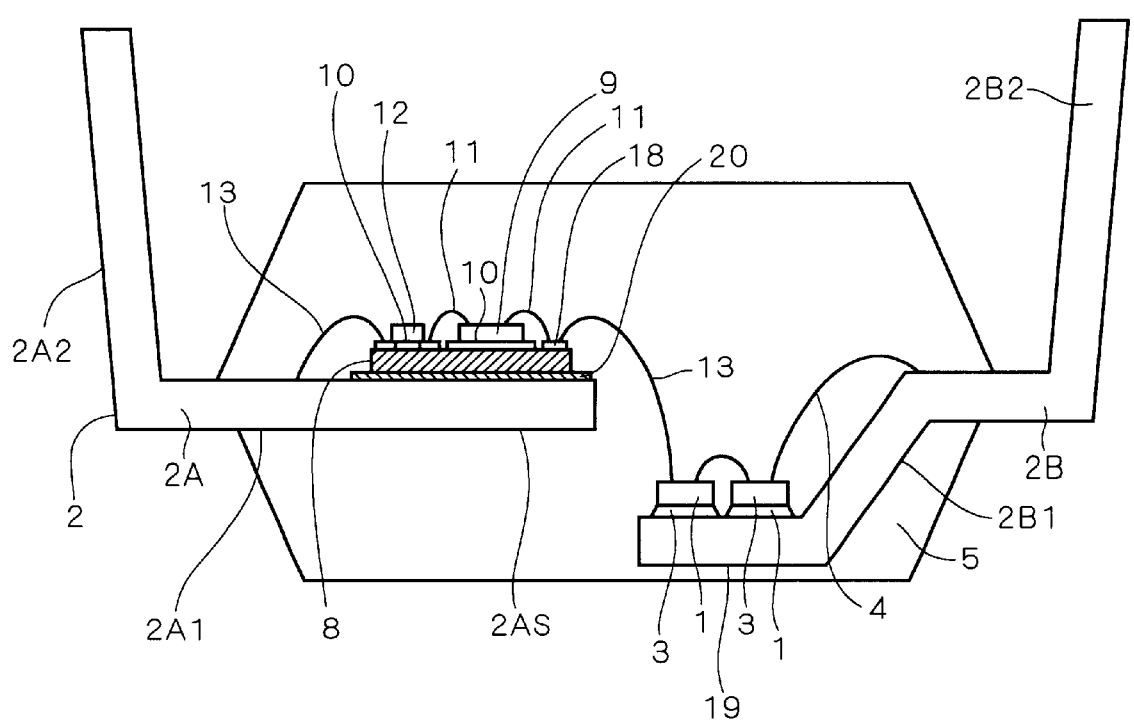
FIG. 1 is a vertical sectional view of a semiconductor device according to a first preferred embodiment of the present invention.
Figure 2:
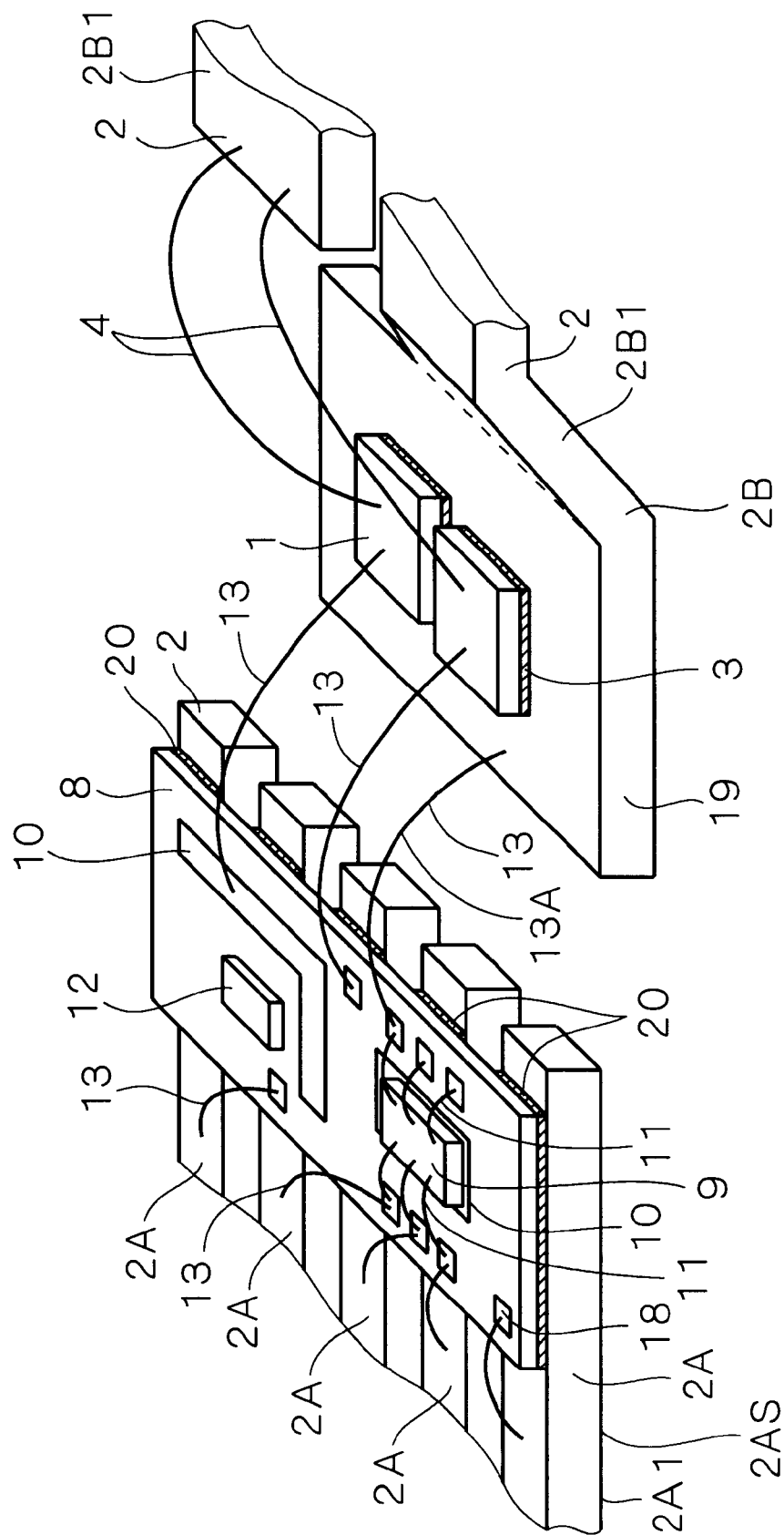
FIG. 2 is a perspective view of the semiconductor device according to the first preferred embodiment.
Figure 10:
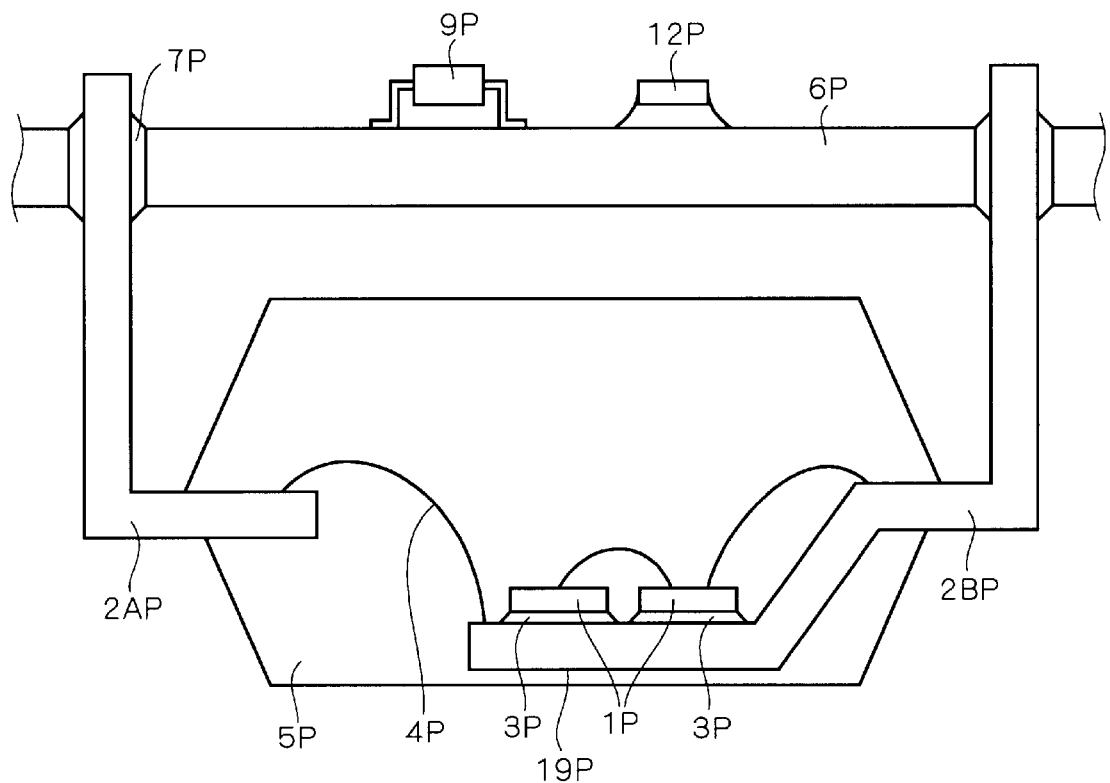
FIGS. 10 and 11 are vertical sectional views of prior art semiconductor devices.
Figure 11:
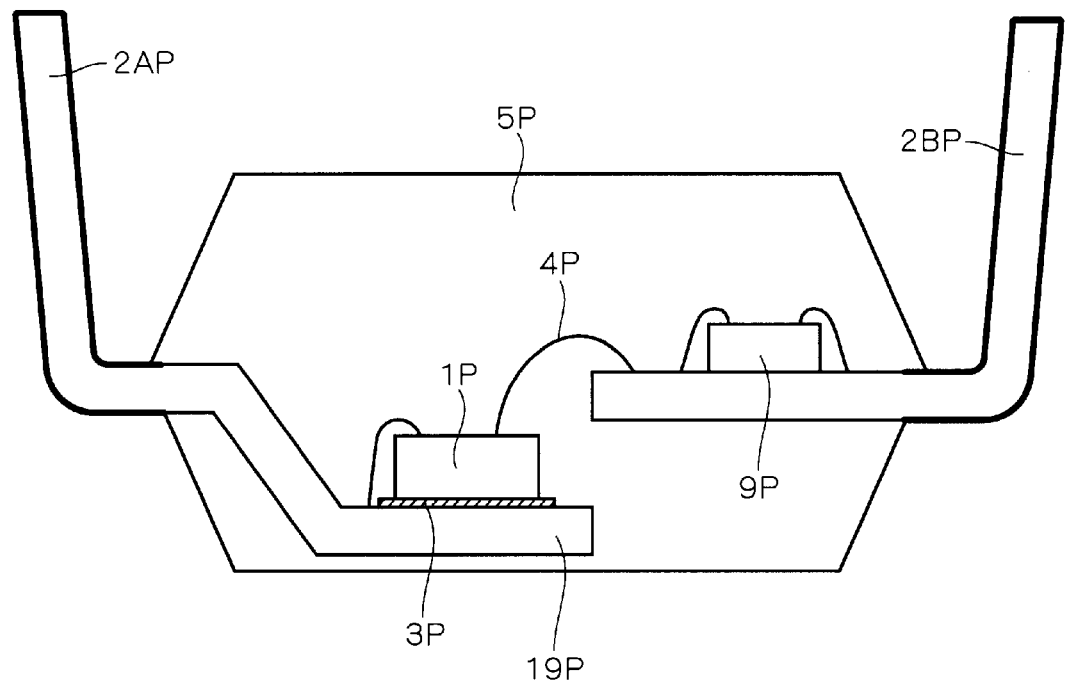

FIG. 1 is a vertical sectional view showing an internal structure of a resin-sealed power semiconductor device according to the first preferred embodiment. FIG. 2 is a perspective view schematically showing the heart of the semiconductor device of FIG. 1. In the device shown in FIGS. 1 and 2, the thicknesses of lead parts 2 (2A, 2B) (comprising inner leads 2A1, 2B1 and outer leads 2A2, 2B2 continuous with the inner leads) and a die pad 19 both of which constitute a frame part are made equal and as great as possible (e.g., within the range of 0.7 mm to 0.8 mm) for the purpose of effectively dissipating or diffusing heat generated by power semiconductor elements 1, as in the prior art device shown in FIG. 10. Among the lead parts 2 of the frame part, a lead part continuous with the die pad 19 of the frame part is also referred to as a second lead part 2B, and inner and outer leads of the second lead part 2B are also referred to as a second inner lead 2B1 and a second outer lead 2B2, respectively. In association with such designation, other lead parts (corresponding to an assemblage of inner leads and outer leads) which are not continuous with the die pad 19 and are positioned above the die pad 19 are referred to as first lead parts 2A, and inner and outer leads of the first lead parts 2A are referred to as first inner leads 2A1 and first outer leads 2A2, respectively.

The power semiconductor elements 1, typically IGBTs and vertical power MOSFETs, are brazed onto a portion of an upper surface of the die pad 19 with a brazing material 3. Electrodes of the respective power semiconductor elements 1 are connected to each other by a thin metal wire such as an Al wire, and a first electrode of each of the power semiconductor elements 1 is connected by a thin metal wire 4 to a second inner lead (corresponding to a second electrode) 2B1 different from (e.g. adjacent to) the second inner lead 2B1 on which the power semiconductor elements 1 are mounted.

On the other hand, a thick film substrate 8 is bonded with a bonding layer 20 comprising, for example, a brazing material, an adhesive or a bonding tape onto upper surfaces of a plurality of inner leads (referred to as supporting inner leads) 2AS constituting the "support of the frame part" among the plurality of second inner leads 2A1. The thick film substrate 8 used herein is a ceramic substrate (e.g., an alumina substrate or an AlN substrate) which allows a thick film pattern to be formed on at least its first main surface. On the first main surface or upper surface of the thick film substrate 8 are formed all patterns 10 of thick film required to constitute the control circuit of the power semiconductor elements 1. A semiconductor element (IC) 9 comprising a microcomputer and the like for controlling the power semiconductor elements 1 is mounted on one of the thick film patterns 10 by soldering, and all electronic components (resistors, capacitors and the like) 12 constituting the control circuit are mounted on the other thick film patterns 10 by soldering. Thin metal wires 11 establish electric connection between electrodes of the semiconductor element 9 and bonding pads 18 of the thick film substrate 8 and between electrodes of the element 9 and electrodes of the electronic components 12. Thin metal wires 13 establish connection between the upper surfaces of the supporting inner leads 2AS serving as a first electrode and the thick film patterns 10 or the bonding pads 18 on the thick film substrate 8, and also establish electric connection between electrodes of the power semiconductor elements 1 and the patterns 10 or the bonding pads 18 of the thick film substrate 8. A thin metal wire 13A (13) with its first end directly bonded onto the upper surface of the die pad 19 establishes electric connection between one of the bonding pads 18 of the thick film substrate 8 and the upper surface of the die pad 19 at its arbitrary position. All of the first inner leads 2A1 including the supporting inner leads 2AS, all of the second inner leads 2B1, the thick film substrate 8 on which the semiconductor element 9 and all of the electronic components 12 are mounted, the power semiconductor elements 1, the die pad 19, and the thin metal wires 4, 11, 13 are sealed in a sealing resin 5. Each of the plurality of first and second outer leads 2A2 and 2B2 projecting outwardly from the sealing resin 5 is formed into a suitable configuration, e.g. substantially L-shaped cross-sectional configuration, and has a tip subjected to surface treatment such as solder plating.

Figure 12:
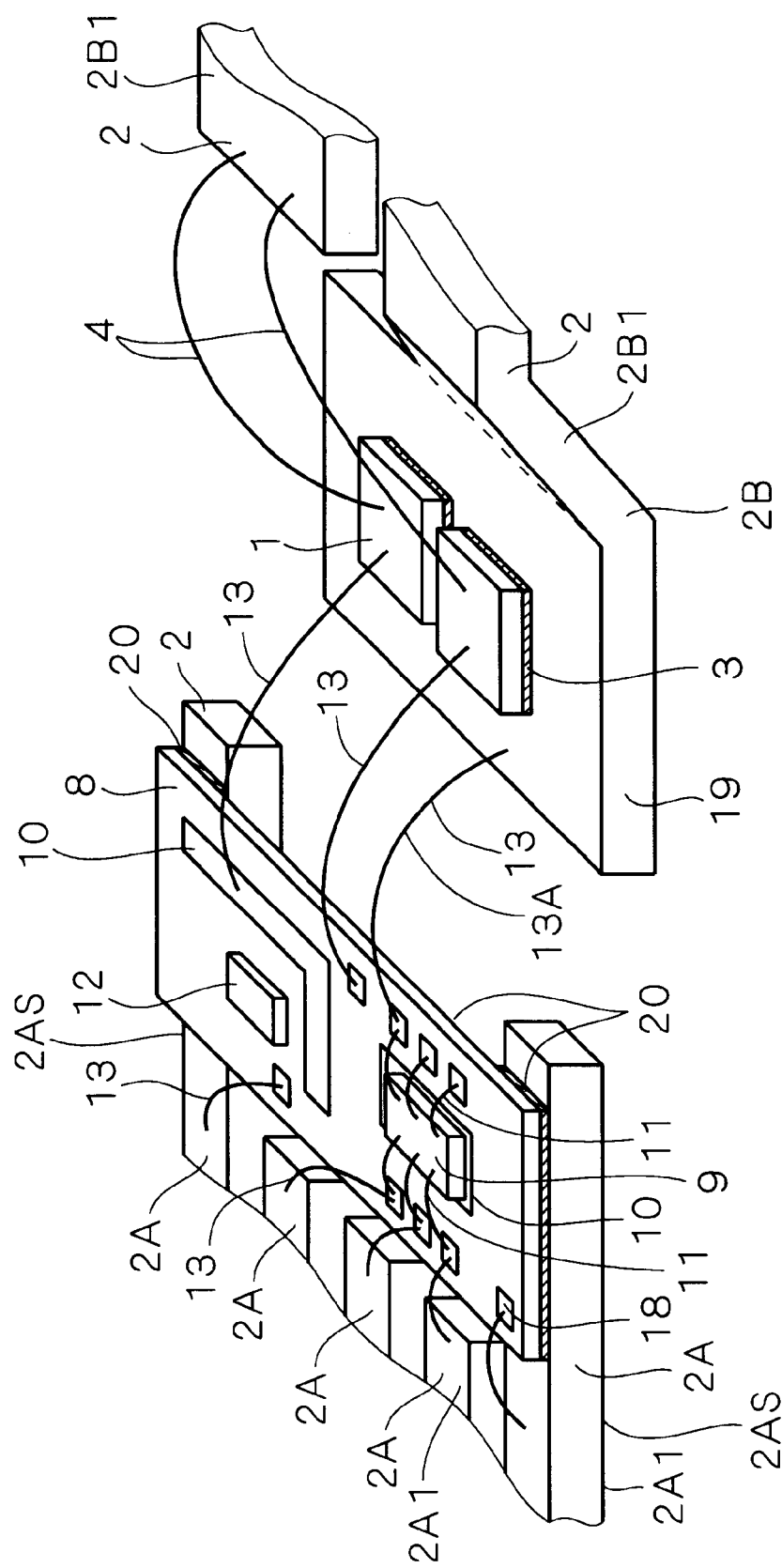
FIGS. 12 and 13 are perspective views of modifications of the semiconductor device according to the first preferred embodiment.

Although the thick film substrate 8 is shown in FIG. 2 as supported by five supporting inner leads 2AS, at least two inner leads 2A1 is required to be used as the supporting inner leads 2AS. For example, two adjacent inner leads 2A1 may be used as the supporting inner leads 2AS. Alternatively, two relatively long inner leads 2A1 may be used as the supporting inner leads 2AS, with several relatively short intermediate inner leads 2A1 arranged between the two relatively long inner leads 2A1 (See FIG. 12).

The semiconductor device of the first preferred embodiment has the following advantages: (1) while maintaining the advantage of the prior art devices, that is, the effect of efficiently dissipating the heat generated by the power semiconductor elements, (2) a significantly reduced length of a path extending from the power semiconductor elements 1 to the semiconductor element (IC) 9 and all of the electronic components 12 for controlling the elements 1 dramatically improves noise immunity over the above-mentioned first and second prior art devices. Additionally, (3) the thick film patterns 10 may be made finer, and all of the electronic components 12 constituting the control circuit of the power semiconductor elements 1 are mounted on such patterns 10 of the thick film substrate 8. Therefore, the use of the thick film substrate 8 facilitates the dramatic increase in packaging density within the sealing resin 5, and allows all of the functions of the semiconductor device which are possessed by the control circuit to be implemented within the sealing resin 5. Consequently, there is no need to provide the control substrate 6P (FIG. 10) for the semiconductor device on the customer's premises. This achieves the reduction in size of customer's device.

(Modifications of First Preferred Embodiment)

Figure 3:
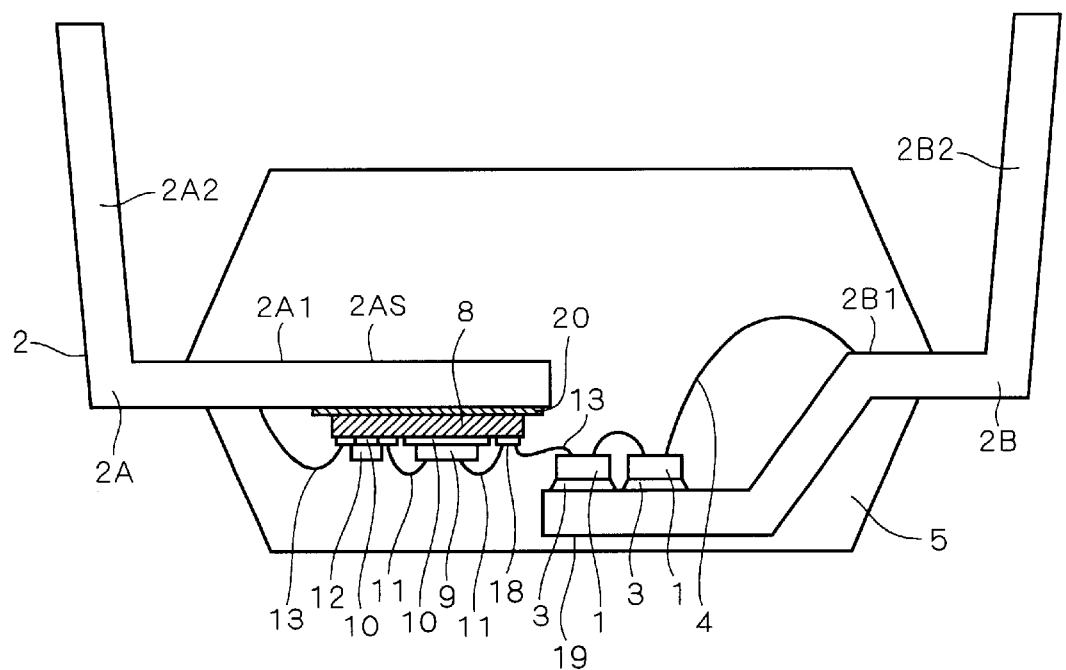
FIGS. 3 and 4 are vertical sectional views of modifications of the semiconductor device according to the first preferred embodiment.

(1) In the first preferred embodiment, the thick film substrate 8 is mounted on the upper surfaces of the supporting inner leads 2AS with the bonding layer 20 therebetween, as illustrated in FIG. 2. Instead, the thick film substrate 8 on which the semiconductor element 9 and all of the electronic components 12 are mounted may be bonded onto lower or bottom surfaces of the supporting inner leads 2AS with the bonding layer 20, as illustrated in vertical cross section of FIG. 3. Needless to say, this produces similar effects.

Figure 4:
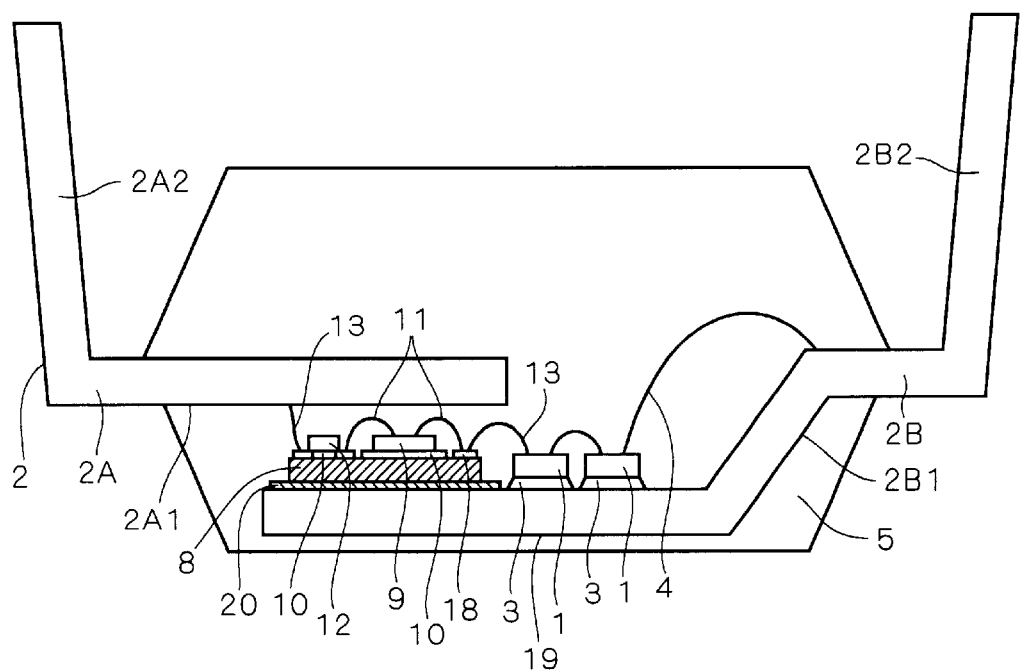

(2) A portion of the die pad 19 on which the power semiconductor elements 1 are not formed may be used as the "support" of the thick film substrate 8 having the structure shown in FIG. 1, in place of the supporting inner leads 2AS of the first preferred embodiment. An example of such an arrangement is shown in FIG. 4. In this modification, as schematically shown in FIG. 4, all of the first inner leads 2A1 function only as the first electrode to be electrically connected to an external device or customer's device.

Figure 5:
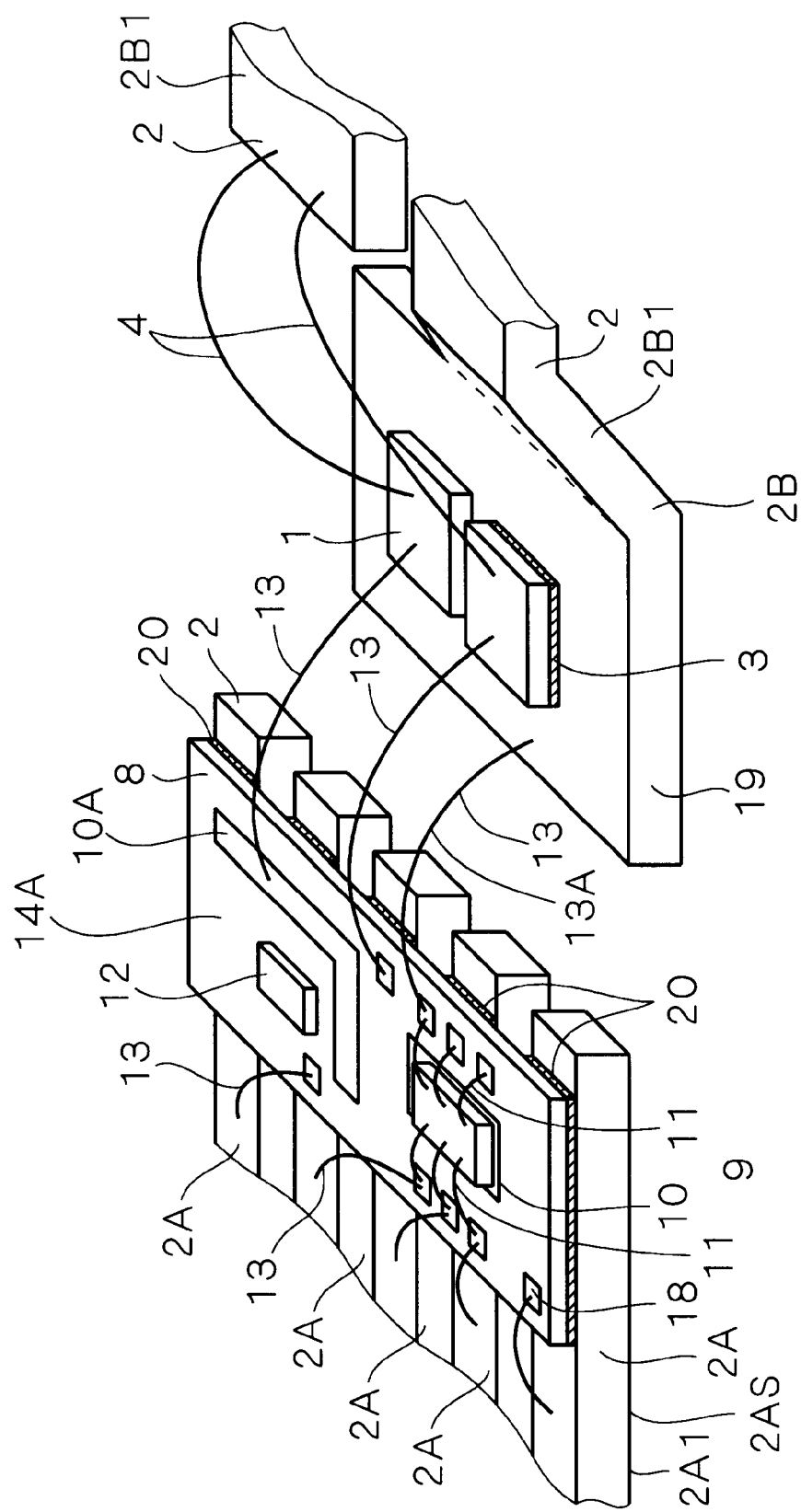
FIG. 5 is a perspective view of a modification of the semiconductor device according to the first preferred embodiment.

(3) A glass epoxy substrate with the control circuit patterns formed on only one of the main surfaces (a first main surface) thereof may be used as the substrate for the control circuit for mounting thereon the semiconductor element 9 and all of the electronic components 12, in place of the thick film substrate 8 of the first preferred embodiment shown in FIGS. 1 and 2. The heart of such an arrangement is schematically shown in perspective view of FIG. 5. As shown in FIG. 5, a second main surface or bottom surface of a glass epoxy substrate 14A is bonded to the upper surface of each of the supporting inner leads 2AS with the bonding layer 20 such as an adhesive or a bonding tape. All control circuit patterns 10A (including bonding pads) of copper foil are formed on the first main surface or upper surface of the substrate 14A, and the semiconductor element (IC) 9 and all of the electronic components 12 are mounted on the patterns 10A.

The modifications (1) and (2) may be applied to the modification (3) and to a modification (4) to be described later.

Figure 13:
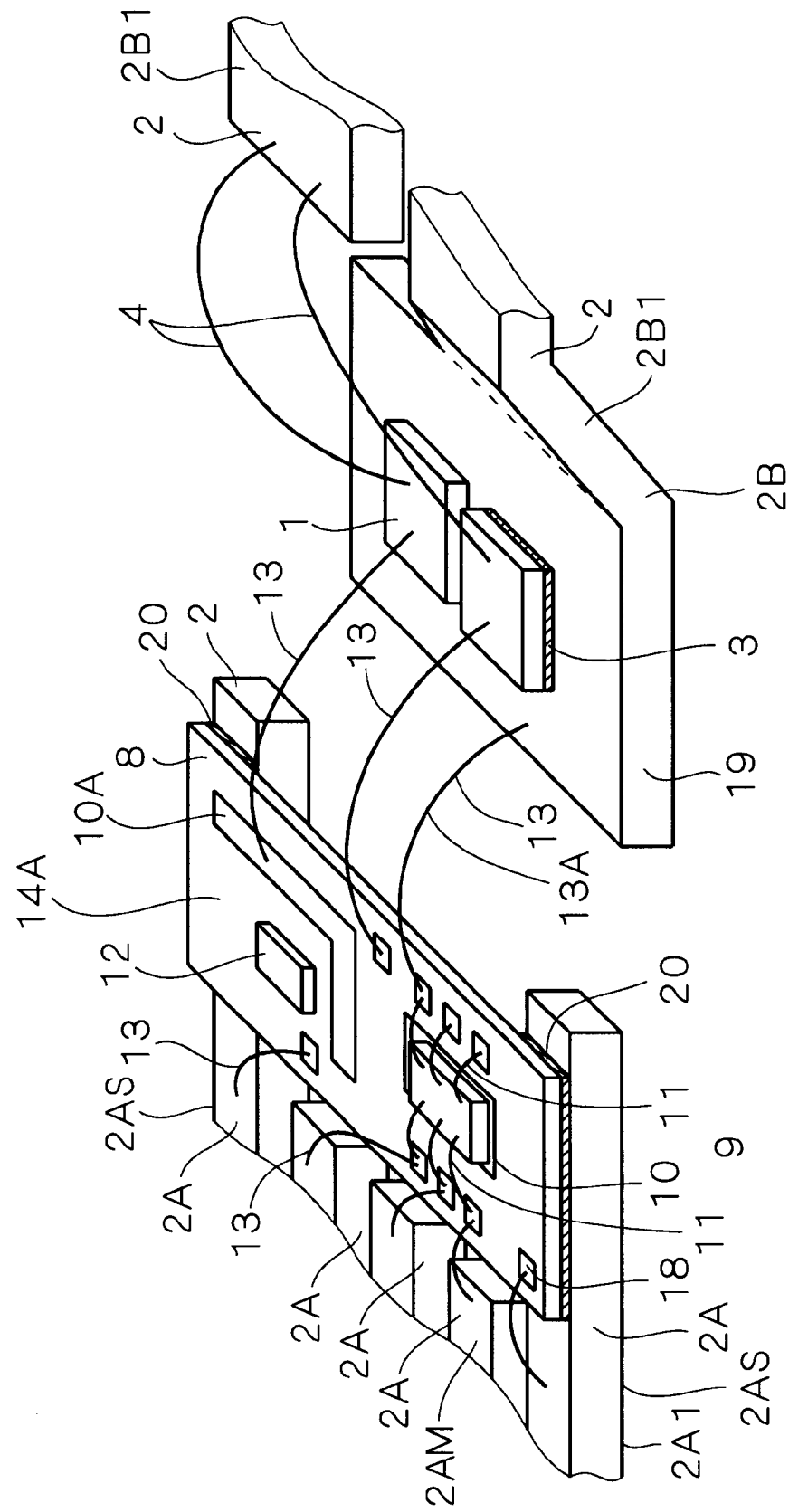

Further, the modification (3) may be also modified in such a manner that the glass epoxy substrate 14A is bonded with the bonding layer 20 onto the upper surfaces of the two inner leads 2AS opposed to each other, with the short intermediate inner leads 2AM arranged therebetween, as illustrated in FIG. 13.

(4) This modification involves an improvement in the modification (3) (FIGS. 5 and 13). An example of the modification (4) is schematically shown in vertical section of FIG. 6. For purposes of illustration, all of the electronic components 12 are not shown in FIG. 6.

Figure 6:
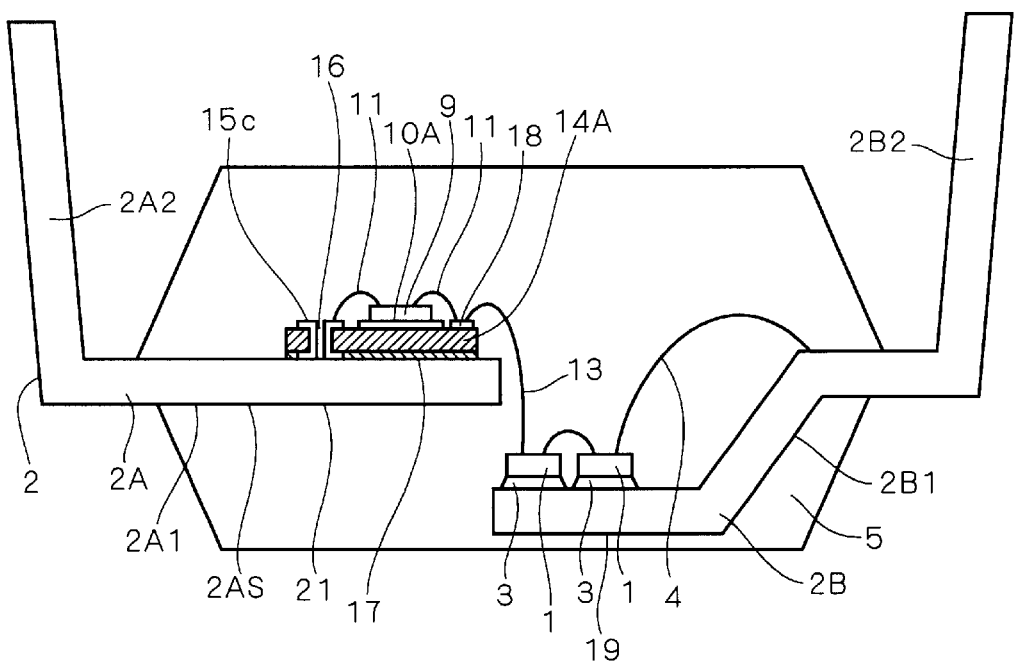
FIG. 6 is a vertical sectional view of a modification of the semiconductor device according to the first preferred embodiment.

An object of this modification is to establish electric connection between pattern portions constituting the bonding pads of the glass epoxy substrate 14A and the corresponding supporting inner leads 2AS by means of patterns provided in through hole parts formed in the substrate 14A in place of the wire bonding using the thin metal wires. To this end, the glass epoxy substrate 14A comprises through hole parts 16 extending through the substrate 14A, the number of through hole parts 16 being equal to the number of supporting inner leads 2AS supporting the substrate 14A. A conducting pattern 15c is provided for each of the through hole parts 16, and is formed on a wall surface of each through hole part 16 and on portions of the first main surface (upper surface) and the second main surface (bottom surface) of the substrate 14 which surround each through hole part 16. A portion of the pattern 15c on the upper surface is wire-bonded by a thin metal wire to the semiconductor element 9 or one of the electronic components 12 (not shown) on the substrate 14A, as illustrated in FIG. 6. The portion of the pattern 15c on the upper surface may be electrically connected to an extension of the control circuit patterns of the substrate 14A. In other words, the portion of the pattern 15c on the upper surface is electrically connected to an electrode of the corresponding semiconductor element 9 or electronic component by at least the thin metal wire. A portion of the conducting pattern 15c on the bottom surface or second main surface is bonded to the upper surface portion of the supporting inner lead 2AS corresponding to the pattern 15c or the through hole part 16 by a conductive bonding layer 17 such as a brazing material. Each bonding layer 17 serves to bond the supporting inner lead 2AS corresponding thereto and the bottom surface portion of the glass epoxy substrate 14A in contact with the lead 2AS to each other, and to provide electric continuity between the control circuit patterns 10A on the substrate 14A and the supporting inner lead 2AS serving as the first electrode for connection to the external device.

According to this modification, each of the through hole parts 16 may be provided in any position within a portion of the substrate 14A to be bonded to the supporting inner lead 2AS corresponding to each through hole part 16. This completely eliminates the constraint such that pads or patterns for electric connection to the supporting inner leads 2AS are required to be provided near the end or corners of the substrate 14A. In this respect, this modification is more advantageous than the modification (3) shown in FIG. 5 in which the thin metal wires 13 establish connection between the control circuit patterns 10A and the supporting inner leads 2AS. This modification completely eliminates the occurrence of such a trouble that the thin metal wires 13, upon contact with a corner of the substrate 14A, is damaged and broken.

In this modification, as described above, the electric connection between the first inner leads 2A1 serving as the electrodes and the patterns 10A on the substrate 14A is established by the through hole parts 16. Therefore, there is no need to provide the thin metal wires for connection between the substrate and the electrodes, and accordingly there is no need to provide the pads for bonding of the thin metal wires. Incidentally, the processes of connecting the patterns 10A on the substrate and the lead parts 2 serving as the electrodes by the thin metal wires and then sealing the patterns 10A and the lead parts 2 in resin involve the following considerations. To avoid the trouble such that the thin metal wires come in contact with the substrate, it is necessary to form the thin metal wires into a short loop for the connection of the patterns 10A and the lead parts 2 by wire bonding, and to provide the bonding pads for the wire bonding near the periphery of the substrate. Thus, there arises a need to route the patterns on the substrate. However, as in this modification, the use of the through hole parts 16 which may be disposed in any position within the substrate 14A does not require the routing of the patterns on the substrate. Additionally, there is no need to provide the bonding pads to be wire-bonded to the first inner leads 2A1. Therefore, a more flexible circuit layout is accomplished.

In the case where the through hole parts can be formed in a ceramic substrate, a thick film substrate comprising a ceramic substrate and a thick film pattern thereon may be used in place of the glass epoxy substrate 14A in this modification.

(Second Preferred Embodiment)

Figure 7:
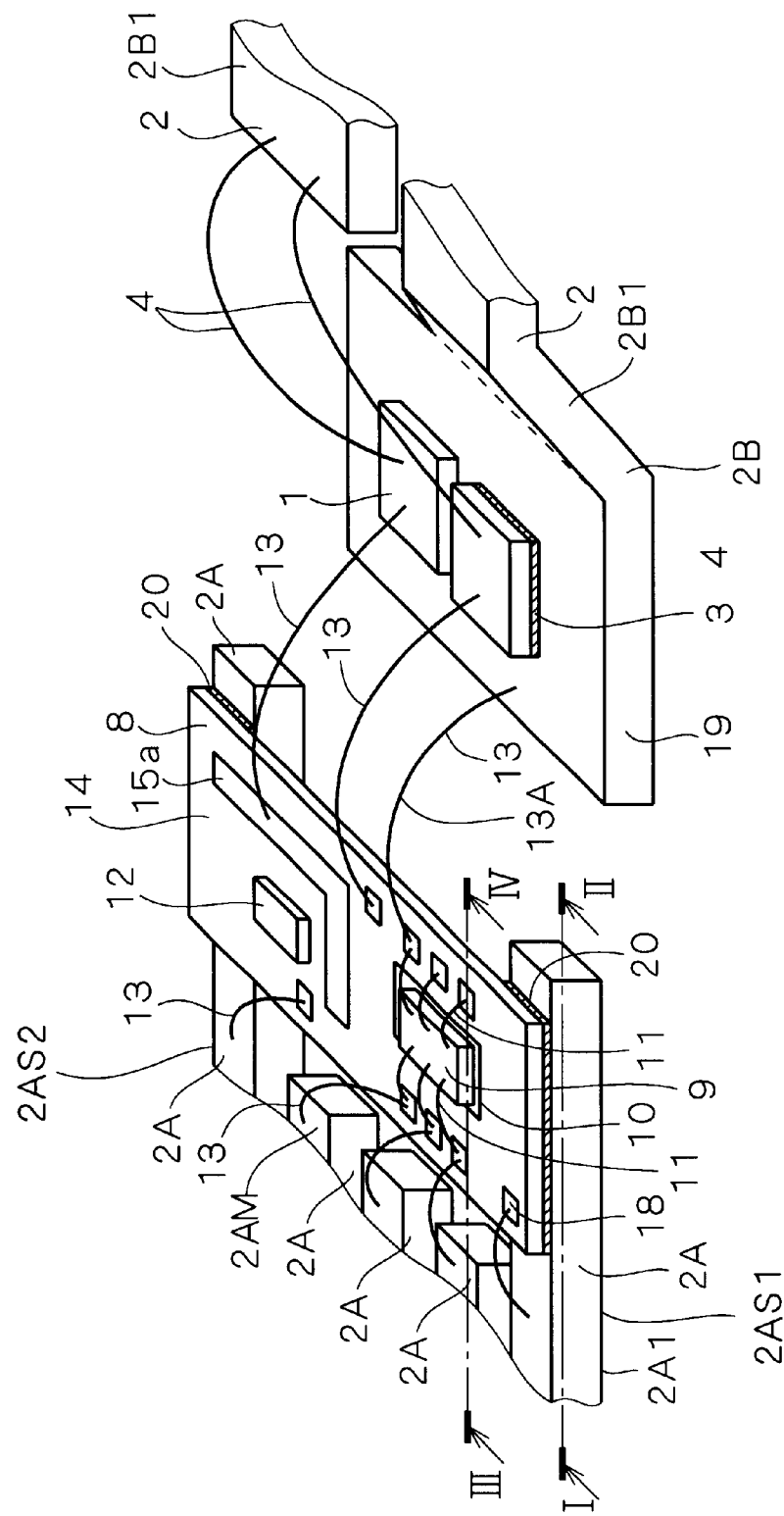
FIG. 7 is a perspective view of a semiconductor device according to a second preferred embodiment of the present invention.
Figure 8:
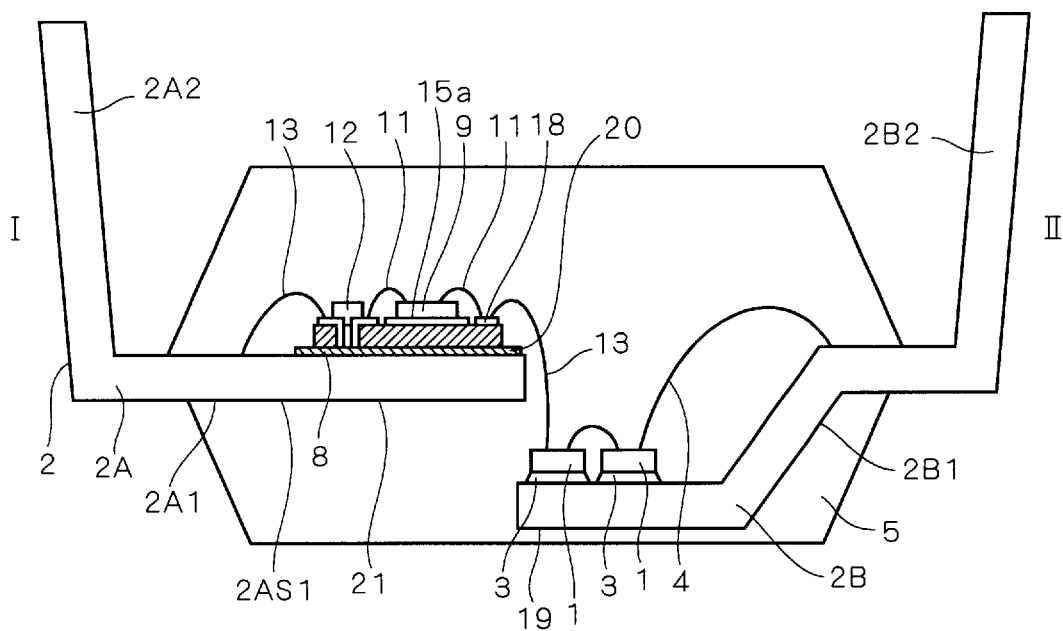
FIGS. 8 and 9 are vertical sectional views of the semiconductor device according to the second preferred embodiment.
Figure 9:
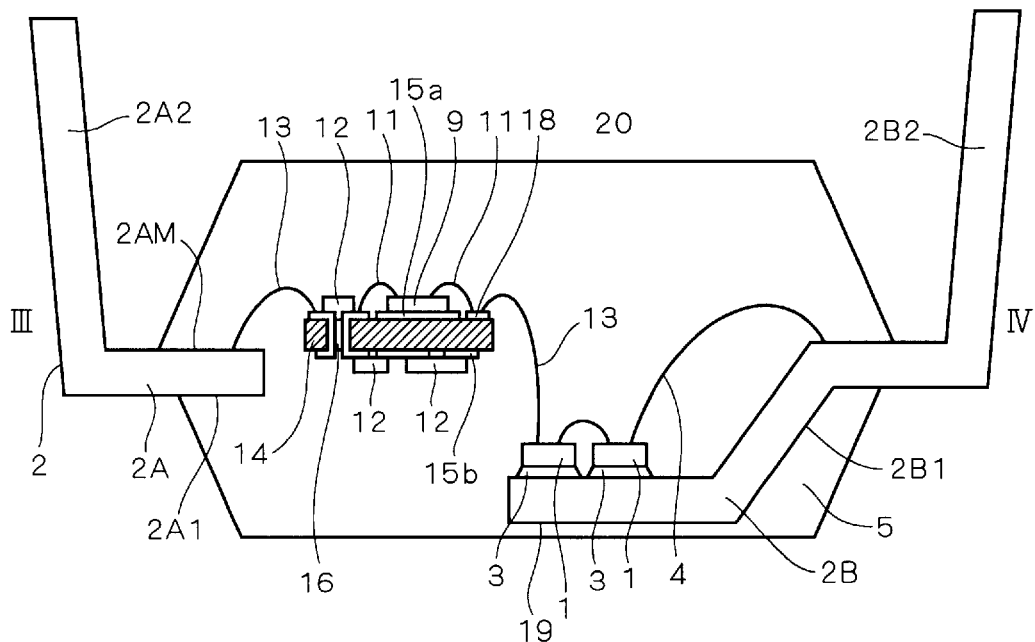

FIG. 7 is a perspective view schematically showing principal parts of the resin-sealed power semiconductor device according to a second preferred embodiment of the present invention. FIGS. 8 and 9 are cross-sectional views taken along the line I—II and the line III–IV of FIG. 7, respectively. For purposes of illustration, the cross-sectional configurations of the through hole parts 16 are shown in the cross sections of FIGS. 8 and 9.

The second preferred embodiment features the use of a double-sided board mounted glass epoxy substrate 14 as the substrate in place of the thick film substrate 8 of the first preferred embodiment. More specifically, all of the electronic components 12 and the semiconductor element (IC) 9 which constitute the control circuit are mounted by soldering or the like on first and second control circuit patterns 15a and 15b (generically referred to as control circuit patterns) formed respectively on a first main surface (upper surface) and a second main surface (bottom surface opposite from the upper surface) of the glass epoxy substrate 14. In particular, in the second preferred embodiment, the element 9 and some of the electronic components 12 are connected to the first control circuit pattern 15a through solder or the like, and the remaining electronic components 12 are mounted on the second control circuit pattern 15b with solder or the like therebetween. The patterns 15a and 15b on the opposite sides are electrically connected to each other through the through hole parts 16 provided in any position within the substrate 14.

Additionally, the bottom surfaces of opposed first and second end portions extending along the shorter sides of the glass epoxy substrate 14 are bonded with the bonding layer 20 such as an adhesive to only the upper surfaces of first and second supporting inner leads 2AS1 and 2AS2 among the plurality of inner leads 2A1. At least one inner lead (referred to as an intermediate inner lead) 2AM between the first and second supporting inner leads 2AS1 and 2AS2 is shorter in length than the first and second supporting inner leads 2AS1 and 2AS2. Opposed third and fourth end portions of the substrate 14 extending along the longer sides thereof and orthogonal to the first and second end portions are not supported by the upper surface of the at least one intermediate inner lead 2AM. In this state, the constituents 1, 19, 2A1, 2B1, 9, 12, 14, 15a, 15b, 16 are sealed in the sealing resin 5.

In the second preferred embodiment, only the opposite ends (the first and second end portions) of the glass epoxy substrate 14 are held by the first and second supporting inner leads 2AS1 and 2AS2, respectively. This structure allows the double-sided board mounting in the middle of the substrate 14. Such a double-sided board mountable structure can double the mounting area of the substrate, and accordingly reduce the sizes of the substrate and the semiconductor device. The size reduction enables the reduction in wiring length, thereby to significantly improve the noise immunity over the prior art devices.

When the through hole parts can be formed in the thick film substrate, the characteristic structure described in the second preferred embodiment may be applied to the thick film substrate used as the substrate.

Also in the second preferred embodiment, the opposite ends of the glass epoxy substrate 14 may be disposed beneath the electrodes, rather than on the electrodes, i.e. may be disposed on the lower surfaces of the above-mentioned first and second supporting inner leads 2AS1 and 2AS2, as described in the modification (1) of the first preferred embodiment, in which case similar effects are produced.

While the invention has been described in detail, the foregoing description is in all aspects illustrative and not restrictive. It is understood that numerous other modifications and variations can be devised without departing from the scope of the invention.

What is claimed is:

1. A resin-sealed power semiconductor device comprising:

a frame part comprising a lead part having a plurality of inner leads and a plurality of outer leads continuous respectively with said plurality of inner leads, and a die pad equal in thickness to said lead part;

a power semiconductor element mounted on a portion of said die pad;

a substrate bonded onto a support of said frame part except said portion of said die pad;

a pattern of a control circuit of said power semiconductor element, said control circuit pattern being formed on at least a first main surface of said substrate;

a semiconductor element mounted on said control circuit pattern for controlling said power semiconductor element;

electronic components all mounted on said control circuit pattern and constituting said control circuit in conjunction with said semiconductor element; and a sealing resin for sealing therein said plurality of inner leads, said die pad, said power semiconductor element, said substrate, said semiconductor element and all of said electronic components.

2. The resin-sealed power semiconductor device according to claim 1, wherein said support of said frame part comprises at least two supporting inner leads among said plurality of inner leads.

3. The resin-sealed power semiconductor device according to claim 2, wherein said substrate is a ceramic substrate, and wherein said control circuit pattern is a thick film pattern.

4. The resin-sealed power semiconductor device according to claim 2, wherein said substrate is a glass epoxy substrate.

5. The resin-sealed power semiconductor device according to claim 2, wherein said substrate comprises a plurality of through hole parts equal in number to said at least two supporting inner leads;

wherein a conducting pattern is provided for each of said through hole parts and formed on a wall surface of each of said through hole parts and on portions of said first main surface and a second main surface of said substrate which surround each of said through hole parts; and wherein a portion of said conducting pattern on said second main surface is bonded with a conductive bonding layer to an associated one of said at least two supporting inner leads.

6. The resin-sealed power semiconductor device according to claim 5, wherein said substrate is a glass epoxy substrate.

7. The resin-sealed power semiconductor device according to claim 2, wherein said support comprises supporting inner leads adjacent to each other.

8. The resin-sealed power semiconductor device according to claim 1, wherein said support of said frame part corresponds to another portion of said die pad.

9. The resin-sealed power semiconductor device according to claim 1, wherein said support of said frame part comprises first and second supporting inner leads among said plurality of inner leads;

wherein at least one intermediate inner lead among said plurality of inner leads which is present between said first and second supporting inner leads is shorter than said first and second supporting inner leads;

wherein said substrate includes
a first end portion supported by said first supporting inner lead, with a bonding layer therebetween,
a second end portion opposite from said first end, portion and supported by said second supporting inner lead, with said bonding layer therebetween, and
third and fourth end portions opposite from each other and orthogonal to said first and second end portions, said third and fourth end portions being unsupported by said at least one intermediate inner lead;

wherein said control circuit pattern includes a first control circuit pattern formed on a first main surface of said substrate, and a second control circuit pattern formed on a second main surface of said substrate, said second main surface being opposite from said first main surface; and wherein said semiconductor element and some of said electronic components are mounted on said first control circuit pattern, and the remainder of said electronic components are mounted on said second control circuit pattern.

10. The resin-sealed power semiconductor device according to claim 9, wherein said substrate is a glass epoxy substrate.

* * * * *